United States Patent
Kohonen et al.

(10) Patent No.: US 7,285,731 B2
(45) Date of Patent: Oct. 23, 2007

(54) EMI GASKET

(75) Inventors: Petri Kohonen, Vantaa (FI); Pentti Immonen, Espoo (FI)

(73) Assignee: Tellabs Oy, Espoo (FI)

( * ) Notice: Subject to any disclaimer, the term of this patent is extended or adjusted under 35 U.S.C. 154(b) by 0 days.

(21) Appl. No.: 11/127,023

(22) Filed: May 10, 2005

(65) Prior Publication Data

US 2005/0269118 A1 Dec. 8, 2005

(30) Foreign Application Priority Data

May 11, 2004 (FI) .................................. 20040666

(51) Int. Cl.
*H05K 9/00* (2006.01)
(52) U.S. Cl. ...................... 174/355; 174/351
(58) Field of Classification Search ............. 174/35 R, 174/35 GC, 355, 351
See application file for complete search history.

(56) References Cited

U.S. PATENT DOCUMENTS

| | | |
|---|---|---|
| 3,594,490 A | 7/1971 | Mitchell |
| 5,001,297 A | 3/1991 | Peregrim et al. |
| 5,045,635 A * | 9/1991 | Kaplo et al. ............ 174/35 GC |
| 5,256,833 A | 10/1993 | Schwenk |
| 5,532,428 A * | 7/1996 | Radloff et al. .......... 174/35 GC |
| 5,559,676 A * | 9/1996 | Gessaman .................... 361/752 |
| 5,959,244 A * | 9/1999 | Mayer .................... 174/35 GC |
| 6,005,186 A * | 12/1999 | Bachman ................... 174/35 R |
| 6,330,139 B1 * | 12/2001 | Liao ............................ 361/86 |
| 6,673,998 B1 * | 1/2004 | Wu ......................... 174/35 GC |
| 2003/0227762 A1 | 12/2003 | Schnabel |

FOREIGN PATENT DOCUMENTS

JP 11-307977 11/1999

* cited by examiner

*Primary Examiner*—Hung V. Ngo
(74) *Attorney, Agent, or Firm*—Young & Thompson

(57) ABSTRACT

The invention relates to an EMI gasket formed by joining coated steel (3) and a contact backing (1). The coated steel (3) has elongated openings (4), into which projections (2) provided on the contact backing fit, seizing by their edges the edges of the openings.

15 Claims, 2 Drawing Sheets

EMI GASKET

BACKGROUND OF THE INVENTION

This invention relates to an EMI gasket formed by joining coated steel and a contact backing.

The EMI gasket of the invention is intended for application to electronic casings and racks to ensure the EMC requirements posed on the finished apparatus. The use of the gasket ensures a completely sealed casing (cf. a Faraday cage) at critical points (of lateral walls).

DESCRIPTION OF THE RELATED ART

There are prior art solutions in which an EMI gasket is dimensioned such that contacts directly an electrically conductive surface of precoated sheet steel (cf. an STU casing).

A solution has also been manufactured and tested that comprises an even contact backing made of spring steel for the EMI gasket. This spring steel has made electric contact with the electrically conductive surface of precoated sheet steel. Shield attenuation measurements have indicated attenuation results of only about 30 dB at a frequency of 2,000 MHz.

However, the electrically conductive coating mentioned above, which has been provided on precoated sheet steel plates, has proved susceptible to mechanical damage, and in the practice, the electric coating has not ensured sufficiently low resistance between the EMI gasket and the sheet steel.

SUMMARY OF THE INVENTION

This invention has the objective of eliminating the drawbacks mentioned above. The EMI gasket of the invention is characterised by the coated steel comprising elongated openings, in which projections from the contact backing are inserted, seizing by their edges the edges of the openings. Different embodiments of the invention are described in The dependent claims of the set of claims.

The EMI gasket of the invention serves to improve electric contact between a precoated steel cage and rack and a second EMI gasket by the backing surface (contact backing) of the metal EMI gasket and attachment of the contact backing to the precoated sheet steel. The fixed contact backing provides an even surface with the desired length, on which the EMI gasket can be either mounted directly in an electrically conductive manner, or against which mechanical and electric contact can be made by a second EMI gasket.

The use of an EMI gasket provides conditions for long-term and reliable electric contact, such that is required when forming an interface shielding against electric interference from an electronic casing or rack.

A protective interface is needed either to protect electronic equipment from external interfering radiation at radio frequency or to protect the environment from intrinsic radiation generated in the electronic equipment.

The differences in the electric potentials of the selected materials are small, given the same basic material of the two members and the very close potentials of zinc coating and iron. This contributes to a minimised risk of galvanic corrosion.

BRIEF DESCRIPTION OF THE DRAWINGS

The invention is explained by means of an example and with reference to the accompanying drawings, in which.

DESCRIPTION OF THE PREFERRED EMBODIMENTS

Figure 1:
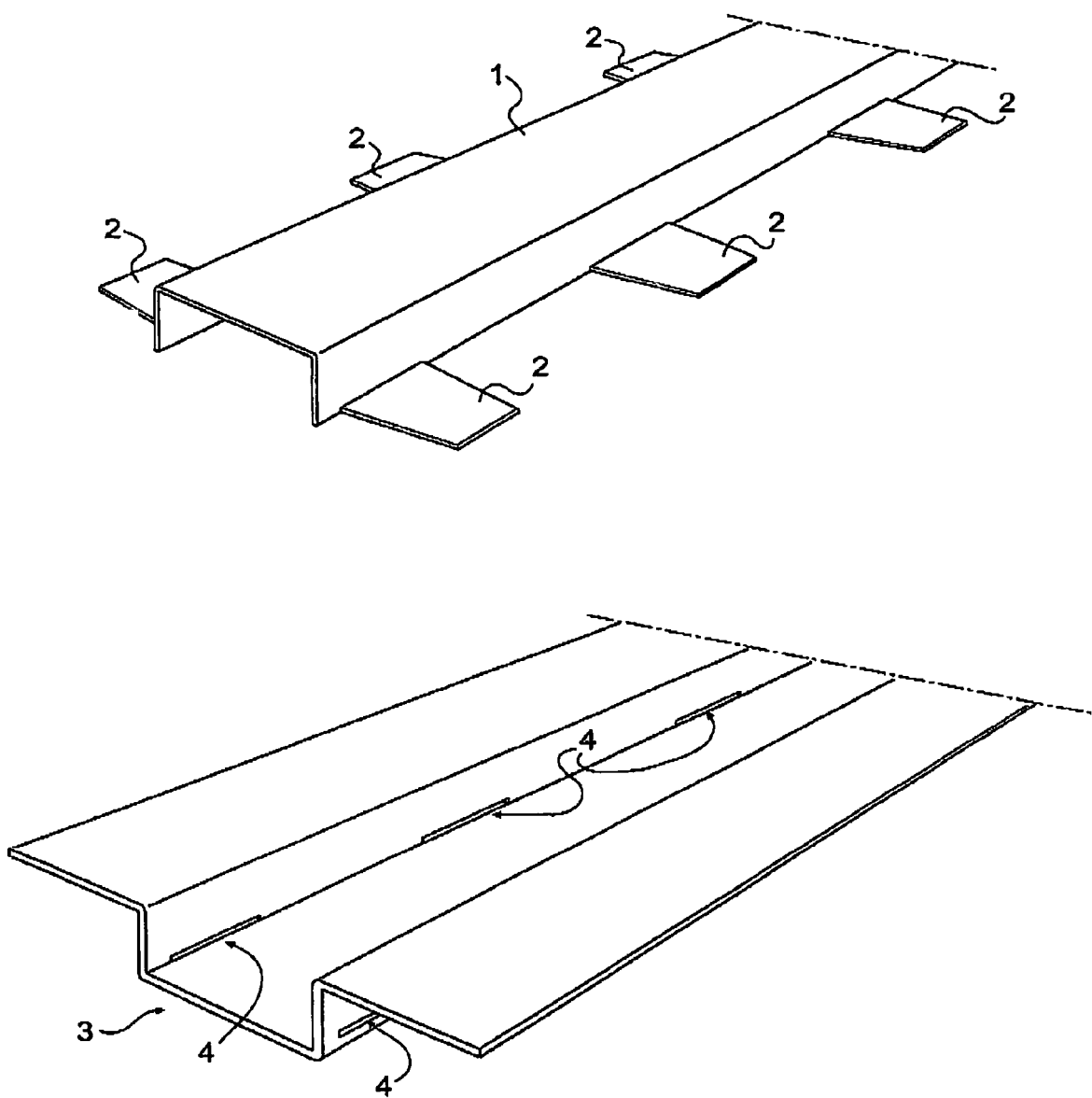
FIG. 1 shows the members of an EMI gasket separated from each other.

A contact backing 1 of the desired length is made from stainless sheet steel. Projections 2 are provided on both sides of the contact backing. The finished contact backing is bent at angles.

The contact backing 1 is mounted in advance in a backing groove 3 made of coated steel plate, the other edge of the groove not being bent at this stage. At the bottom of the groove, at both edges, rectangular openings 4 are provided with the same dimensioning as that of the projections 2 on the contact backing. The length of the openings 4 matches the projection 2 of the contact backing with high precision, for the projection to cut material from the precoated sheet steel edge 3 as the members are joined.

Figure 2:
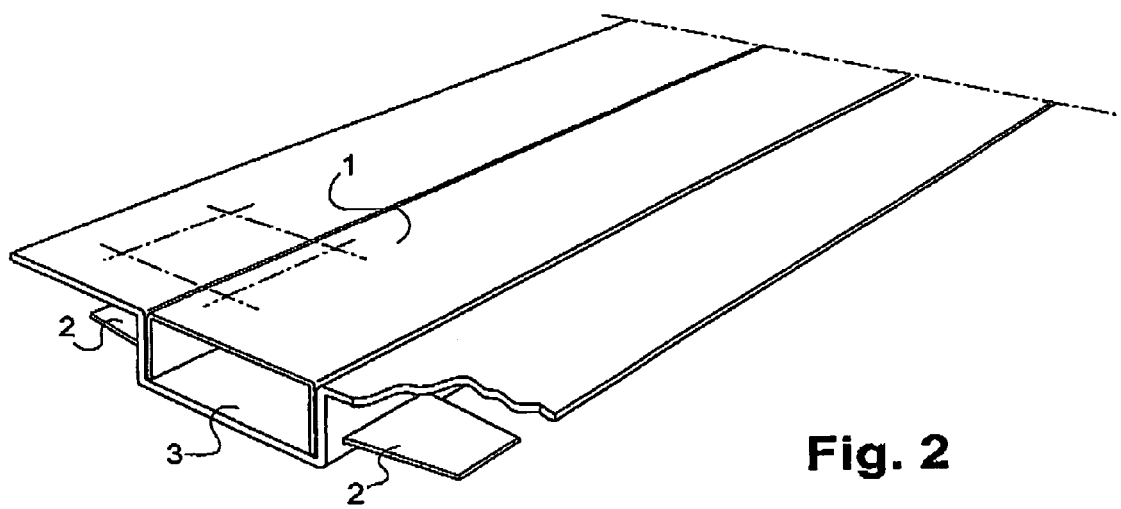
FIG. 2 shows the same members as FIG. 1, but joined to form the EMI gasket.
Figure 3:
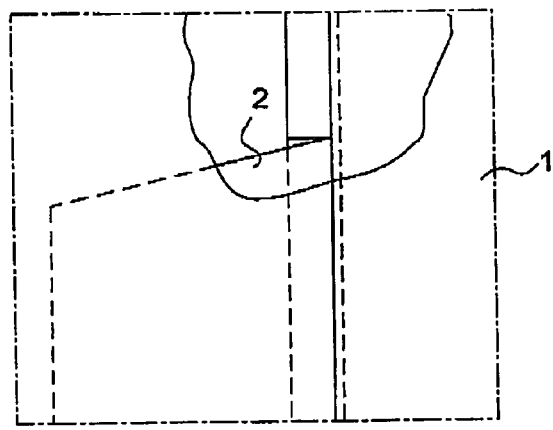
FIG. 3 shows an enlargement of the location marked with a dotted line in FIG. 2, viewed from the top and partially cut.

With reference to FIGS. 1-3, the inventive EMI gasket comprises the backing groove (3) with the contact backing (1) mounted in the backing groove. The contact backing has a) an upper horizontal surface, b) first and second vertical sides, c) upper edges of the first and second vertical sides connected to opposite edges of the upper horizontal surface, and d) plural horizontal projections (2) at lower edges of each of the first and second vertical sides. As shown, the plural horizontal projections extend away from the first and second vertical sides and the upper horizontal surface.

The backing groove has a) a lower horizontal surface, b) third and fourth vertical sides, c) lower edges of the third and fourth vertical sides connected to opposite edges of the lower horizontal surface, d) first and second upper horizontal surfaces connected respectively to upper edges of the third and fourth vertical sides, and e) plural rectangular openings (4) at each of the lower edges of the third and fourth vertical sides. As shown, the first and second upper horizontal surfaces extend away from the third and fourth sides and the lower horizontal surface.

Also as shown, each projection extends through a corresponding one of the rectangular openings.

The invention claimed is:

1. An EMI gasket consisting of a joint of coated steel and a contact backing, the coated steel comprising elongated openings and the contact backing comprising projections, wherein, lengths of said elongated openings are disposed to match lengths of said projections so that said projections are disposed to seize by their edges with edges of said elongated openings by cutting material from the edges of said elongated openings as a response to pushing said projections into said elongated openings, areas of the coated steel from which material is cut providing a long term electrical contact, wherein the coated steel is a U-shaped groove, having at its bottom pairs of openings, into which projections on the contact backing fit as the members are joined.

2. An EMI gasket as defined in claim 1, wherein the contact backing is a U-shaped groove turned upside down, from which projections protrude into opposite directions.

3. An EMI gasket as defined in claim 1, wherein the contact backing is a U-shaped groove turned upside down, from which projections protrude into opposite directions.

4. An EMI gasket as defined in claim 1, wherein the projection has a shape tapering conically outwardly from its edges so that the edges seize the edges of the openings.

5. An EMI gasket as defined in claim 1, wherein the coated steel is made of zinc-coated iron and the contact backing is made of stainless sheet steel.

6. An EMI gasket comprising:
a joint of coated steel, and
a contact backing, wherein,
the coated steel comprises elongated openings of a first length, and
the contact backing comprises projections, with a first width less than the first length, the projections disposed to fit into said elongated openings and to seize by their edges with edges of said elongated openings by cutting material from the edges of said elongated openings as a response to pushing said projections into said elongated openings, the projections cutting material from the coated steel as the projections are joined in said elongated openings,
wherein the coated steel is a U-shaped groove, having at its bottom pairs of openings, into which projections on the contact backing fit as the members are joined.

7. An EMI gasket as defined in claim 6, wherein the contact backing is a U-shaped groove turned upside down, from which projections protrude into opposite directions.

8. An EMI gasket as defined in claim 6, wherein the projection has a shape tapering conically outwardly from its edges so that the edges seize the edges of the openings.

9. An EMI gasket as defined in claim 6, wherein the coated steel is made of zinc-coated iron and the contact backing is made of stainless sheet steel.

10. An EMI gasket, comprising:
a backing groove (3); and
a contact backing (1) mounted in the backing groove,
the contact backing having
a) an upper horizontal surface,
b) first and second vertical sides,
c) upper edges of the first and second vertical sides connected to opposite edges of the upper horizontal surface, and
d) plural horizontal projections (2) at lower edges of each of the first and second vertical sides,
the plural horizontal projections extending away from the first and second vertical sides and the upper horizontal surface,
the backing groove having
a) a lower horizontal surface,
b) third and fourth vertical sides,
c) lower edges of the third and fourth vertical sides connected to opposite edges of the lower horizontal surface,
d) first and second upper horizontal surfaces connected respectively to upper edges of the third and fourth vertical sides,
the first and second upper horizontal surfaces extending away from the third and fourth sides and the lower horizontal surface, and
e) plural rectangular openings (4) at each of the lower edges of the third and fourth vertical sides, wherein,
each projection extends through a corresponding one of the rectangular openings.

11. The EMI gasket of claim 10, wherein,
the contact backing is stainless steel, and
the backing groove is coated steel.

12. The EMI gasket of claim 10, wherein,
the contact backing is stainless steel, and
the backing groove is zinc-coated iron.

13. The EMI gasket of claim 10, wherein,
a width of each projection matches a length of the corresponding opening.

14. The EMI gasket of claim 11, wherein,
a width of each projection matches a length of the corresponding opening.

15. The EMI gasket of claim 10, wherein,
the projections are tapered.

* * * * *